United States Patent
Kruus et al.

(10) Patent No.: US 9,531,403 B2
(45) Date of Patent: Dec. 27, 2016

(54) ADAPTIVE COMPRESSION SUPPORTING OUTPUT SIZE THRESHOLDS

(71) Applicant: NEC Laboratories America, Inc., Princeton, NJ (US)

(72) Inventors: Erik Kruus, Hillsborough, NJ (US); Cristian Ungureanu, Princeton, NJ (US)

(73) Assignee: NEC Corporation (JP)

( * ) Notice: Subject to any disclaimer, the term of this patent is extended or adjusted under 35 U.S.C. 154(b) by 274 days.

(21) Appl. No.: 14/319,336

(22) Filed: Jun. 30, 2014

(65) Prior Publication Data

US 2015/0088945 A1 Mar. 26, 2015

Related U.S. Application Data

(60) Provisional application No. 61/882,449, filed on Sep. 25, 2013.

(51) Int. Cl.
  *G06F 7/00* (2006.01)
  *H03M 7/30* (2006.01)

(52) U.S. Cl.
  CPC ............ *H03M 7/30* (2013.01); *H03M 7/6011* (2013.01); *H03M 7/6035* (2013.01)

(58) Field of Classification Search
  CPC ..... H03M 7/6035; H03M 7/30; H03M 7/6011
  USPC ........................................................ 708/203
  See application file for complete search history.

(56) References Cited

U.S. PATENT DOCUMENTS

| | | | |
|---|---|---|---|
| 6,519,052 B1 | 2/2003 | Oneda et al. | |
| 7,188,130 B2 * | 3/2007 | Luick | H04N 19/172 375/E7.095 |
| 2002/0107587 A1 * | 8/2002 | Araki | G06T 9/00 700/68 |
| 2004/0134464 A1 * | 7/2004 | Mogi | F02D 15/04 123/406.12 |

OTHER PUBLICATIONS

Agarwala, S., et al. "iCostale: Adaptive Cost Optimization for Storage Clouds" 2011 IEEE 4th International Conference on Cloud Computing. Jul. 2011. pp. 436-443.

Deng, X., et al. "Online Adaptive Compression in Delay Sensitive Wireless Sensor Networks" IEEE Transactions on Computers, vol. 61, No. 10. Oct. 2012. pp. 1429-1442.

Ortega, A. "Optimization Techniques for Adaptive Quantization of Image and Video Under Delay Constraints" Thesis. Columbia University. 1994. pp. 161-198.

Pu, C., et al. "Fine-Grain Adaptive Compression in Dynamically Variable Networks" Proceedings of the 25th IEEE International Conference on Distributed Computing Systems. Jun. 2005. pp. 1-10.

(Continued)

*Primary Examiner* — Tan V. Mai
(74) *Attorney, Agent, or Firm* — Joseph Kolodka

(57) ABSTRACT

Methods and systems for adaptive compression include compressing input data according to a first compression ratio; pausing compression after a predetermined amount of input data is compressed; estimating which of a set of ranges a compressed output size will fall within using current settings; and performing compression on a remainder of the input data according to a second compression ratio based on the estimated range.

8 Claims, 2 Drawing Sheets

(56) References Cited

OTHER PUBLICATIONS

Singh, D., et al. "Energy Efficient Network Data Transport through Adaptive Compression using the DEEP Platforms" 2012 IEEE 8th International Conference on Wireless and Mobile Computing, Networking and Communications (WiMob). Oct. 2012. pp. 253-260.
Zobel, J., et al. "Adding Compression to a Full-text Retrieval System" Software—Practice and Experience, vol. 25, No. 8. Aug. 1995. pp. 891-903.

\* cited by examiner

ADAPTIVE COMPRESSION SUPPORTING OUTPUT SIZE THRESHOLDS

RELATED APPLICATION INFORMATION

This application claims priority to provisional application Ser. No. 61/882,449 filed on Sep. 25, 2013, incorporated herein by reference.

BACKGROUND

Technical Field

The present invention relates to compression and, more particularly, to adaptive compression that changes compression methods based on output size thresholds.

Description of the Related Art

A goal of data compression is to compress an input to a smaller number of output bytes. However, in some applications, only outputs of certain sizes are used. For example, storage may be quantized in blocks (e.g., 512 bytes, 4 kilobytes, 64 kilobytes), where a block will take the same amount of physical space regardless of whether it is filled to capacity or stores only one byte of information. Current compressors do not adapt computation to coarsely quantized sizes of compressor output (and do not adapt to ensure that compression time/CPU constraints are likely to be met for arbitrary input data), leading to significant inefficiencies if compression is continued past the point where it is useful.

Some compressors are byte-oriented, and conventional adaptive compression is typically based on cost factors such as time, network bandwidth, or input/output cost. To the extent that any such techniques do consider output size as an element of their cost functions, the cost is determined as being proportional to the number of output bytes. Such adaptive compression techniques fail to account for discrete output size thresholds.

A number of compressors operate somewhat adaptively by performing an analysis phase on blocks of input data, arriving at pre-calculated functions of the input data. These outputs of the analysis phase are used to decide which of several compression schemes to invoke on the entire data block. Useful pre-calculated functions of the input data are efficiently computable, such as statistical estimation of entropy, or most frequently occurring, or simply the number of zero bytes. Thereafter, the previous approaches compress each block of data independently. One disadvantage of this approach is that the internal state of one compressor cannot easily be used to enhance the compression of an ensuing data block.

SUMMARY

A method for adaptive compression includes compressing input data according to a first compression ratio; pausing compression after a predetermined amount of input data is compressed; estimating which of a plurality of ranges a compressed output size will fall within using current settings; and performing compression on a remainder of the input data according to a second compression ratio based on the estimated range.

A system for adaptive compression includes a compression engine that has a processor configured to compress input data according to a first compression ratio, to pause compression after a predetermined amount of input data is compressed, to estimate which of a plurality of ranges a compressed output size will fall within using current settings, and to perform compression on a remainder of the input data according to a second compression ratio based on the estimated range.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
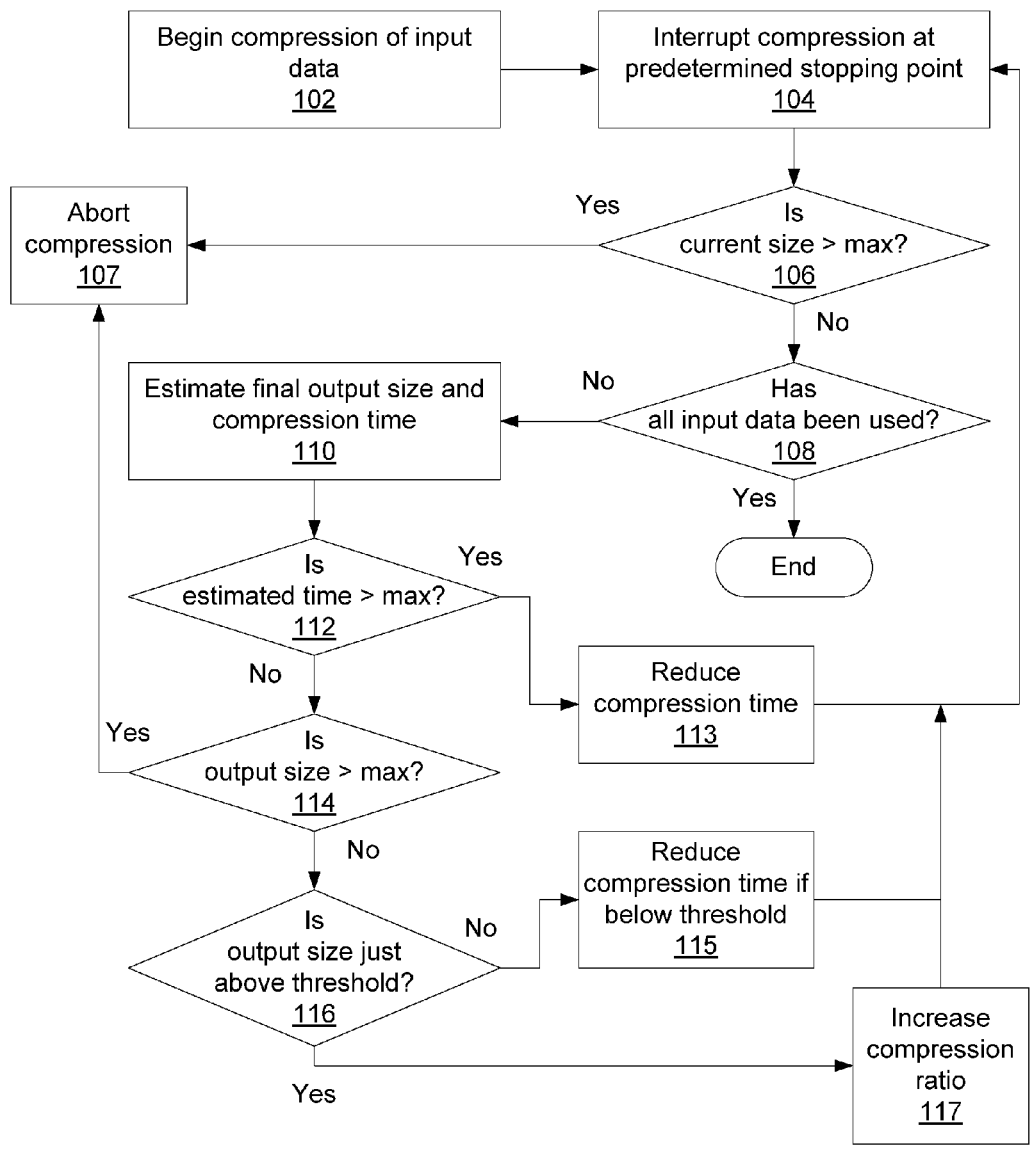
FIG. 1 is a block/flow diagram of a method for adaptive compression in accordance with the present principles.

Embodiments of the present principles provide adaptive compression methods that are sensitive to output size thresholds. For applications in which only certain output sizes are of use, continuing to perform compression past a threshold output size may require more time and computing effort than is necessary. Alternatively, a large benefit might be achieved if compression size could be decreased by a small number of bytes, and if time happens to be available for additional compression computations.

In one example, a cache is targeted in which memory must hold metadata for a large number of 32 kB inputs that are compressed. To minimize the memory overhead, the present embodiments compress data that is stored in allocation units of either 8 kB, 16 kB, 24 kB, or 32 kB. Storing any number of bytes in the range 8193 to 16536 bytes represents an equivalent cost, as any such data will be stored using the full 16 kB. The present compression methods therefore adapt, using less CPU in compression and allowing the output to expand closer to 16536 output bytes. Alternatively, the present embodiments may increase the compression ratio at the cost of additional CPU time in an effort to compress input that might otherwise take, e.g., 16600 bytes into 16536 bytes or less. In this way, the adaptive compression of the present embodiments takes advantage of the output threshold sizes to optimize for storage and for speed, as appropriate. It should be noted that the compression ratio is defined as being the ratio of the uncompressed size to the compressed size. Thus, a higher compression ratio will indicate more compression and a smaller output size than would be produced by a lower compression ratio.

The type of adaptive compression described herein makes its decisions based on time-varying features that may be interrogated multiple times during the compression of a single data block. These time varying features (such as current input position, current output bytes, current elapsed compression time, and possibly other internal state variables of the compressor) are not pre-calculated functions of the input data, but are a natural byproduct of running the compression algorithm itself. In this fashion, a separate phase of pre-calculating input data characteristics can be avoided. The types of compressors targeted, in particular, have a serial nature of processing input bytes and progressively producing output bytes. In this way the compression algorithm can be interrupted at expeditious points, the time varying features can be consulted, and the future behavior of the compression algorithm can be adapted. Various compressors of the Liv-Zempel variety are particularly suited to applications of the present principles; however, block compressors such as those based on Burrow-Wheeler transforms may be less suited, since a large number of CPU cycles may be spent performing the transform itself, before any output bytes are produced.

Compared to traditional techniques, interrupting one compression algorithm during processing of a single input data block provides advantages over multiple invocations of independent compressors on smaller-size sections of input data. The advantage stems in part from the fact the internal state of a single compressor from previous smaller-size sections is retained. This often results in a better compression ratio for ensuing sections of data, reflecting the general compression principle that compressing larger chunks is more useful than compressing multiple small blocks independently. Approaches that try to cleverly place chunk boundaries may deviate from this general principle, at the cost of additional CPU.

The present embodiments interrupt compression at predetermined input byte positions. When interrupted, the current compressor state and time are used to predict a final output size, time, and accuracy if the compression continues "as is." Other compression settings may result in different predictions and accuracy. For example, a given compression algorithm may have an option of producing a low compression ratio quickly, or a high compression ratio if more time is used. Furthermore, different compression options may produce more or less certainty in the time needed for completion. In the extreme case, compression may be turned off entirely and the remaining input may be copied as a literal output, such that the time to completion and final output size may be predicted with high accuracy.

The estimated compression time(s) for different options may be compared to a desired time target. The predicted output sizes (and their error estimates) are compared to a list of target output sizes. Based on these comparisons, compression may continue as is, may change its parameters (thereby changing its compression ratio), may change to a different compression algorithm, resort to literal copy of remaining input, or may abort the compression attempt entirely. These decisions are made to guide compression, over a number of attempts, to produce final output sizes that tend to be just under a threshold size, providing for more efficient use of CPU time and storage space.

Referring now to the figures, and initially to FIG. 1, a block/flow diagram is shown that sets out adaptive compression responsive to output size thresholds. Block 102 begins compression on a set of input data using any appropriate compression algorithm. The compression algorithm should have options for varying the compression ratio. In one exemplary embodiment, a dictionary-based LZW (Lempel-Ziv-Welch) technique may be used.

Block 104 interrupts compression at some predetermined point in the input data. This provides a point to evaluate the remaining data to determine how best to proceed. Several factors may be considered in choosing the stopping point. If compression is interrupted too often, CPU cycles may be wasted, particularly since block 110 may involve checking a larger number of conditions. This also breaks apart the particularly efficient inner loops of typical LZ-style compressors which are often hand-crafted to make best use of modern CPU features. In one example, an application for compressing 32 k chunks of input data is used with 3 nominal stopping points (8 k, 16, 24 k) in addition to the normal stopping point at the end of the input data. The compressor may be modified to stop after the next nominal stopping point had been past, but in such a way that no "extra" conditional branches are introduced into the inner compression loop(s). In other words, the compression algorithm would stop whenever convenient after a nominal stopping point.

Analysis of the overall behavior of the compressor may then be performed to determine additional stopping points in block 104. One case is near the end of compressing input bytes of a chunk (i.e. after the nominal 24 k stopping point), where compressed output size and compression time estimates for the chunk become more trustworthy. In this situation, it becomes useful to estimate an input byte position after which an uncompressed literal copy of bytes from the input to output stream would yield an output size of equivalent usefulness (i.e. not causing output size to exceed a quantization threshold). This avoids trying to compress tail-end bytes, which expends CPU in situation where no useful gain in compressed output size is likely. Another case where additional stopping points may be used is with very high (e.g., >1 Gb/s of input bytes) targeted compression rates. In one test, many real-life input data chunks on a desktop's storage were already over 75% of the time budget after only 4 k of input data due to a high compression ratio. In such a case, it may be useful to introduce an earlier stopping point in block 104 to quickly check for particularly slow-to-compress data blocks and abort compression (see below). Stopping points may be determined dynamically, during compression. For example, it may be beneficial to require that the next stopping point be e.g. at least 4 k input bytes after the current number of input bytes processed.

If the current output size has exceeded a predetermined maximum at block 106, then block 107 aborts the compression. The output data bytes are discarded and the entire input chunk is stored uncompressed. As an example, with input chunks of 32 kB and output quantization thresholds at 8 k, 16 k, 24 k and 32 k (equivalent to the input chunk size), any block whose output size is 24 k+1 bytes or more is just as useful to the storage application as a block of 32 k bytes. Therefore, it saves CPU to simply abort compression and store the full 32 k input bytes verbatim. The maximum useful output size is the second largest quantization threshold, namely 24 k in this example.

If the entirety of the input data has been used at block 108, the compression completes and the output file is produced, ending processing. If there is still input data remaining, block 110 estimates the final output size of the compression, using the current compression settings, and estimates the time to complete the compression using those settings. If the estimated time exceeds a maximum threshold at block 112, then because not all data has been used, the next stopping point is determined and compression continues at block 104 after reducing compression time in block 113. Reducing compression time may be accomplished by changing parameters toward a lower compression ratio or by performing a literal copy of the remaining input bytes to the output.

In one exemplary embodiment, latency requirements and the CPU requirements of other system components lead to a target average compression speed of 1 GB/s. For 32 k input data chunks, this equates to 32 µs of CPU time for compression. In this example, a larger CPU time is undesirable, because compression then adds significantly to the latency of an input/output operation. Exemplary embodiments may estimate final compression time in block 110 by linear extrapolation (time only) or by multi-dimensional table lookup.

In another exemplary embodiment, the logical equivalent of blocks 110 and 112 may be performed by directly answering the simpler question, "Is the final compression time likely to be greater than 32 µs?" This decision may be based on identifying regions of (input size, output size, time)-space having conditional probabilities of exceeding the maximum time threshold that are, e.g., greater than about 75%. Regions of such conditional probability may be experimentally determined by analyzing detailed compression logs after compression of an entire device's storage. Similarly, the logical equivalent of blocks 110 and 114 may also be implemented as a decision tree, instead of as depicted in FIG. 1. Several cycles of conditional probability determination may be needed to build a suitable decision tree. This is because decision tree regions determined for earlier nominal stopping points in block 104 influence conditional probabilities determined at later stopping points.

If the estimated time is still less than the maximum threshold in block 112, block 114 determines whether the estimated output size is larger than a maximum threshold. If the output size is expected to exceed a maximum size threshold, then block 107 aborts the compression. As above, if the estimated output size of block 114 is highly likely (e.g., having a probability greater than 75% in a decision tree implementation) to be greater than the second largest quantization threshold (e.g., 24 k, with an input chunk size and largest useful size of 32 k), then there is no benefit to producing a compressed chunk. In an exemplary embodiment, a fixed maximum for block 114 may be empirically determined by adding the estimated prediction uncertainty in the prediction of output size estimates to the second largest quantization threshold. Prediction uncertainties may be estimated by experiments measuring the standard deviation of final output size compared to final actual output size, where actual output size is found by continuing current compression settings until the end of the input chunk. For example, the maximum of block 114 might be set at 25 k as in indicator that output size is likely to be too large to be of any use if the estimated uncertainty in the output size prediction is about 1 k. Other heuristic mechanisms may be used, such as table lookup or analytical formulas for prediction errors to establish the maximum.

If the output size is below the maximum threshold, processing proceeds to block 116, which determines whether the estimated output size is in the vicinity of one of the output size thresholds. In one exemplary embodiment, the output size thresholds may occur in steps of 8 kb, such that the estimated size is compared to multiple thresholds. If the estimated size is just over an output size threshold, then block 117 increases the compression ratio to get the estimated size below the threshold. For example, if the compressor settings to increase compression ratio are estimated to compress to 10% fewer bytes on average, one can predict the compressed size by assuming remaining input bytes will compress 10% better than the current compression ratio. If the new predicted compressed output is under the quantization threshold described above, the new settings are adopted. Equivalently, the test may be performed as in block 116 with a heuristic region [Q,Q+N], where Q is a quantization threshold and N is a rough idea of the uncertainty in the predicted output size, increasing the compression ratio for all final output sizes estimated to lie in a range [Q,Q+N]. In one exemplary embodiment, three different compressor settings may be used (apart from trivial cases of aborting compression and emitting the rest of bytes as literals). Particularly at early stopping points at block 104, where output sizes may be quite uncertain, the options may be limited to raising the compression ratio at block 117 and to reducing compression time at block 113 one step at a time.

In this way, bad or inadequate decisions would have a chance to later be corrected or improved, with greater certainty of usefulness, at a next stopping point in block 104. If at block 116 the output size is not just above the threshold, block 115 reduces the compression time and decreases the compression ratio if the size is sufficiently below the threshold that compressing faster would not cause the final output size to exceed the next higher quantization threshold. This allows the output data to fill up space before the next threshold.

Embodiments of the present invention may be implemented in hardware, firmware or software, or a combination of the three. Preferably the embodiments are implemented in a computer program executed on a programmable computer having a processor, a data storage system, volatile and non-volatile memory and/or storage elements, at least one input device and at least one output device.

Each computer program is tangibly stored in a machine-readable storage media or device (e.g., program memory or magnetic disk) readable by a general or special purpose programmable computer, for configuring and controlling operation of a computer when the storage media or device is read by the computer to perform the procedures described herein. The inventive system may also be considered to be embodied in a computer-readable storage medium, configured with a computer program, where the storage medium so configured causes a computer to operate in a specific and predefined manner to perform the functions described herein.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 2:
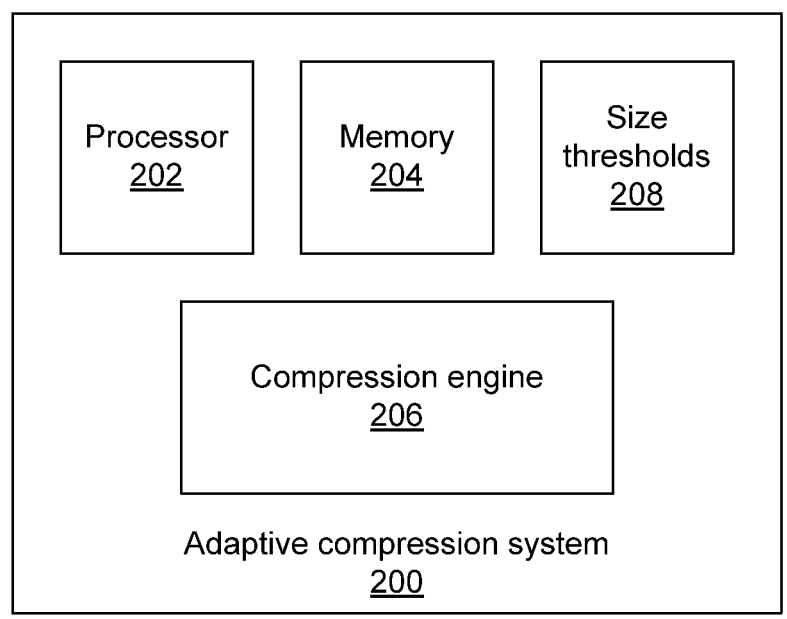
FIG. 2 is a block diagram of a system for adaptive compression in accordance with the present principles.

Referring now to FIG. 2, a system 200 for adaptive compression with size thresholds is shown. The system 200 includes a processor 202 and a memory 204, which stores data to be compressed as well as data after compression. A compression engine 206 uses processor 202 to perform compression on input data. Although a dictionary-based LZW compression is specifically contemplated, this compression can be performed using any appropriate compression technique that allows for a degree of adaptive compression.

The compression engine 206 uses information regarding threshold sizes 208 to perform adaptive compression as described above. These threshold sizes may be based specifically on the structure of memory 204, but it is also contemplated that the thresholds may be based on other factors as long as they are characterized by discrete jumps in cost based on exceeding the threshold. As described above, the compression engine 206 pauses compression at a predetermined point and determines how to proceed based on the size of the compressed output. If an estimated output size is above, but close to, a threshold, the compression engine 206 may increase the level of compression at the cost of additional CPU time to bring the estimated size below the threshold. If the estimated size is not close to the threshold, then the compression engine 206 may decrease the level of compression to a point where the output data size will be just under the next higher threshold. This saves time in cases where the additional savings in output size would not be advantageous.

The invention has been described herein in considerable detail in order to comply with the patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. A system for adaptive compression, comprising:
a compression engine comprising a processor configured to compress input data according to a first compression ratio, to pause compression after a predetermined amount of input data is compressed, to estimate a plurality of ranges of a compressed output size using current settings, and to perform compression on a remainder of the input data according to a second compression ratio based on the estimated range.

2. The system of claim 1, wherein the plurality of ranges correspond to integer multiples of a storage block size.

3. The system of claim 1, wherein said step of performing compression comprises using a second compression ratio that is higher than the first compression ratio if the higher second compression ratio will produce an estimated compressed output size that is below a closest lower range threshold.

4. The system of claim 1, wherein said step of performing compression comprises using a second compression ratio that is lower than the first compression ratio if a higher compression second compression ratio would not produce an estimated compressed output size that is below a closest lower range threshold.

5. The system of claim 4, wherein the second compression ratio is set to produce a compressed output size that is below a closest higher range threshold.

6. The system of claim 1, further comprising aborting compression if a current output size at pausing exceeds a maximum threshold.

7. The system of claim 1, wherein the compression engine is further configured to repeat the pausing of compression, the estimation of the compressed output size, and the comparison of the estimated compressed output size to a plurality of thresholds after performing compression according to the second compression ratio.

8. A non-transitory computer readable storage medium comprising a computer readable program for adaptive compression, wherein the computer readable program when executed on a computer causes the computer to perform the steps of:
compressing input data according to a first compression ratio;
pausing compression after a predetermined amount of input data is compressed;
estimating a plurality of ranges of a compressed output size using current settings; and
performing compression on a remainder of the input data according to a second compression ratio based on the estimated range.

* * * * *